(12) United States Patent
Zhou

(10) Patent No.: US 10,211,839 B2
(45) Date of Patent: Feb. 19, 2019

(54) SYSTEM AND METHOD OF AUTOMATIC POWER CONTROL SYSTEM AND BIAS CURRENT CONTROL CIRCUIT

(71) Applicant: VIA Alliance Semiconductor Co., Ltd., Shanghai (CN)

(72) Inventor: Yongqi Zhou, Shanghai (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 149 days.

(21) Appl. No.: 15/338,671

(22) Filed: Oct. 31, 2016

(65) Prior Publication Data

US 2017/0366189 A1    Dec. 21, 2017

(30) Foreign Application Priority Data

Jun. 16, 2016   (CN) .......................... 2016 1 0425332

(51) Int. Cl.
| | |
|---|---|
| *H03L 5/00* | (2006.01) |
| *H03L 5/02* | (2006.01) |
| *G05F 1/56* | (2006.01) |
| *H03B 5/32* | (2006.01) |
| *H03B 5/12* | (2006.01) |
| *H03B 5/36* | (2006.01) |

(52) U.S. Cl.
CPC .................. *H03L 5/02* (2013.01); *G05F 1/56* (2013.01); *H03B 5/1215* (2013.01); *H03B 5/32* (2013.01); *H03B 5/364* (2013.01); *H03L 5/00* (2013.01); *H03B 2200/0062* (2013.01)

(58) Field of Classification Search
CPC .... H03B 5/06; H03B 5/32; H03B 1/04; H03L 5/00; H03L 5/02; G05F 1/56
USPC .............. 331/185, 167, 158, 116 FE, 117 FE
See application file for complete search history.

(56) References Cited

U.S. PATENT DOCUMENTS 7,262,671 B2 * 8/2007 Maeder .................... H03B 5/06
                                                       331/116 FE
7,538,673 B2   5/2009 Balachandran et al.
(Continued)

FOREIGN PATENT DOCUMENTS

| CN | 101501878 A | 8/2009 |
| CN | 103066942 A | 4/2013 |

(Continued)

*Primary Examiner* — Arnold Kinkead
(74) *Attorney, Agent, or Firm* — McClure, Qualey & Rodack, LLP

(57) ABSTRACT

A bias-current-control circuit is provided. The bias-current-control circuit includes a transconductance circuit, a constant-current source, and a current-mirror circuit. The transconductance circuit is connected to a node and detects a voltage signal to generate a first current. The constant-current source is connected to the node and generates a tail current. The current-mirror circuit includes a reference current terminal and a bias current terminal, and the reference current terminal is coupled to the node. A second current which flows through the reference current terminal is determined by a current difference between the tail current and the first current. A bias current which flows through the bias current terminal is generated based on the second current. Furthermore, the second current and the bias current are in a predetermined ratio.

9 Claims, 7 Drawing Sheets

(56) References Cited

U.S. PATENT DOCUMENTS

| | | | |
|---|---|---|---|
| 8,305,153 B2 * | 11/2012 | Ramet | H03B 5/06 |
| | | | 331/108 R |
| 8,816,790 B2 | 8/2014 | Sinoussi | |
| 2008/0048793 A1 | 2/2008 | Koerner | |
| 2016/0181978 A1 * | 6/2016 | Mittal | H03B 5/364 |
| | | | 331/116 FE |

FOREIGN PATENT DOCUMENTS

| | | |
|---|---|---|
| CN | 104782049 A | 7/2015 |
| JP | 2011019009 A | 1/2011 |

* cited by examiner

1

SYSTEM AND METHOD OF AUTOMATIC POWER CONTROL SYSTEM AND BIAS CURRENT CONTROL CIRCUIT

CROSS REFERENCE TO RELATED APPLICATIONS

The present application is based on, and claims priority of, China Application Number 201610425332.3, filed on Jun. 16, 2016, the invention of which is hereby incorporated by reference herein in its entirety.

BACKGROUND OF THE INVENTION

Field of the Invention

The present invention relates to a current-control circuit, and in particular it relates to a bias-current-control circuit applied to an oscillator circuit.

Description of the Related Art

In general, the amplitude of a voltage signal generated by an oscillator circuit is related to the bias setting of the oscillator circuit. When the bias current of the oscillator circuit is increased, the amplitude of the voltage signal generated by the oscillator circuit can usually be increased as well. In some cases, the oscillator circuit in a circuit system is not required to generate a voltage signal with the maximum amplitude, which the oscillator circuit can provide, and the designer of the circuit system usually takes the amplitude of the voltage signal and the power consumption generated by the bias current of the oscillator circuit into consideration and adjusts these features based on the performance requirements of the circuit system.

BRIEF SUMMARY OF THE INVENTION

A detailed description is given in the following embodiments with reference to the accompanying drawings.

An embodiment of a bias-current-control circuit is provided. The bias-current-control circuit comprises a transconductance circuit, a constant-current source, and a current-mirror circuit. The transconductance circuit is connected to a node and detects a voltage signal to generate a first current. The constant-current source is connected to the node and generates a tail current. The current-mirror circuit includes a reference current terminal and a bias current terminal, and the reference current terminal is coupled to the node. A second current which flows through the reference current terminal is determined by a current difference between the tail current and the first current. A bias current which flows through the bias current terminal is generated based on the second current. Moreover, the second current and the bias current are in a predetermined ratio.

An embodiment of an automatic power-control system is provided. The automatic power-control system comprises an oscillator circuit and a bias-current-control circuit. The oscillator circuit outputs a voltage signal. The bias-current-control circuit includes a transconductance circuit, a constant-current source, and a current-mirror circuit. The transconductance circuit is connected to a node and detects the voltage signal to generate a first current. The constant-current source, connecting the node and generating a tail current. The current-mirror circuit includes a reference current terminal coupled to the node and a bias current terminal connected to a current input terminal of the oscillator circuit. A second current which flows through the reference current terminal is determined by a current difference between the tail current and the first current. A bias current which flows through the bias current terminal is generated based on the second current. Moreover, the second current and the bias current are in a predetermined ratio.

An embodiment of an automatic power-control method is provided. The automatic power-control method comprises generating, by a transconductance circuit, a first current based on a voltage signal output by an oscillator circuit; generating, by a current-mirror circuit, a bias current according to a current difference between the first current and a tail current of a constant-current source; and providing the bias current to the oscillator circuit. The second current and the bias current are in a predetermined ratio.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
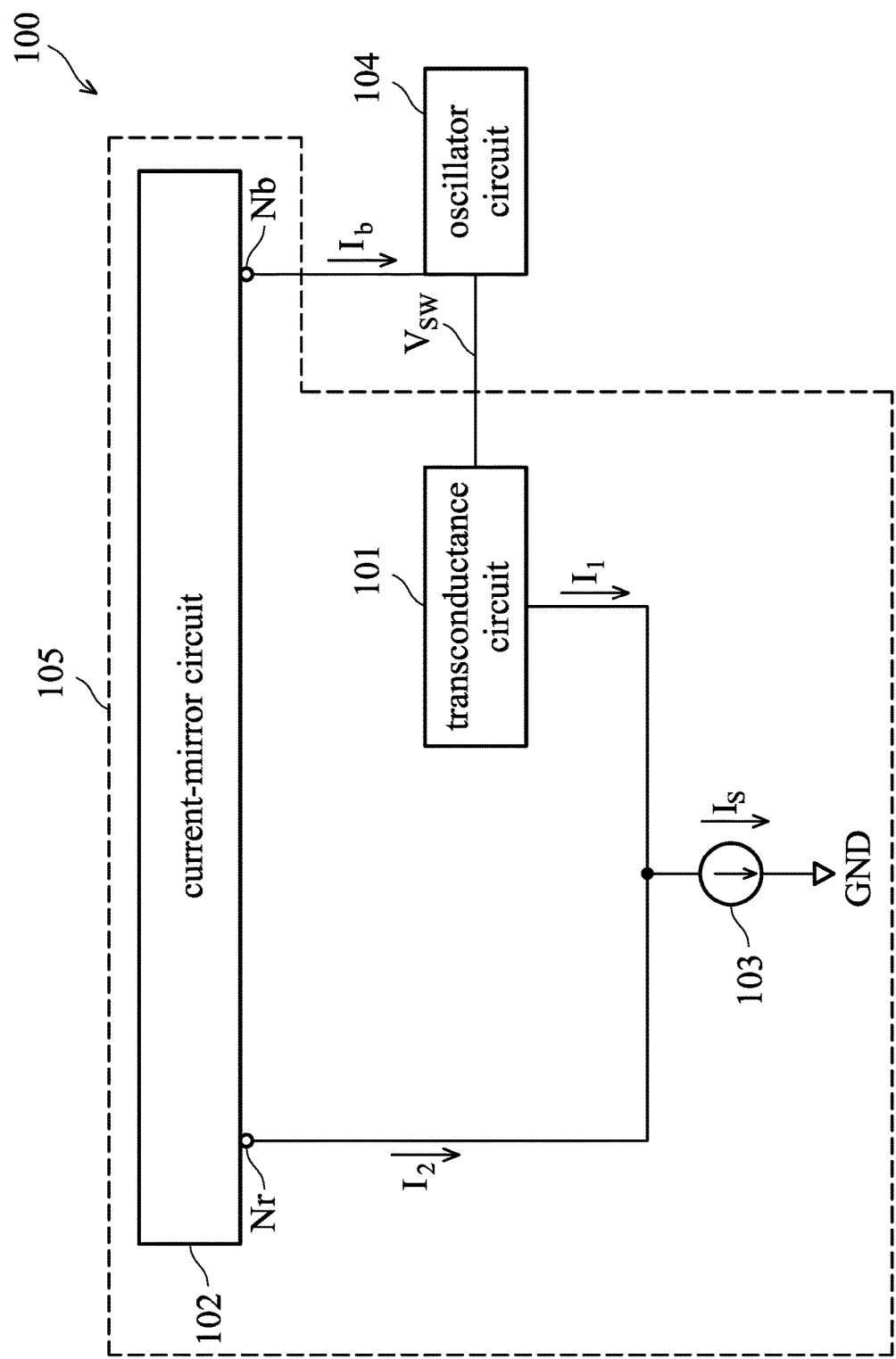
FIG. 1A is a schematic diagram of an automatic power-control system according to some embodiments of the present disclosure.

FIG. 1A shows an automatic power-control system 100 according to some embodiments of the present invention. The automatic power-control system 100 includes a bias-current-control circuit 105 and an oscillator circuit 104. The bias-current-control circuit 105 comprises a transconductance circuit 101, a current-mirror circuit 102, and a constant-current source 103.

In FIG. 1A, the tail current $I_s$ of the constant-current source 103 is a constant current (or substantially constant current), and the current $I_2$ which flows through the reference current terminal $N_r$ of the current-mirror circuit 102 is equal to the current difference between the tail current $I_s$ of the constant-current source 103 and the current $I_1$ generated by the transconductance circuit 101.

Figure 1B:
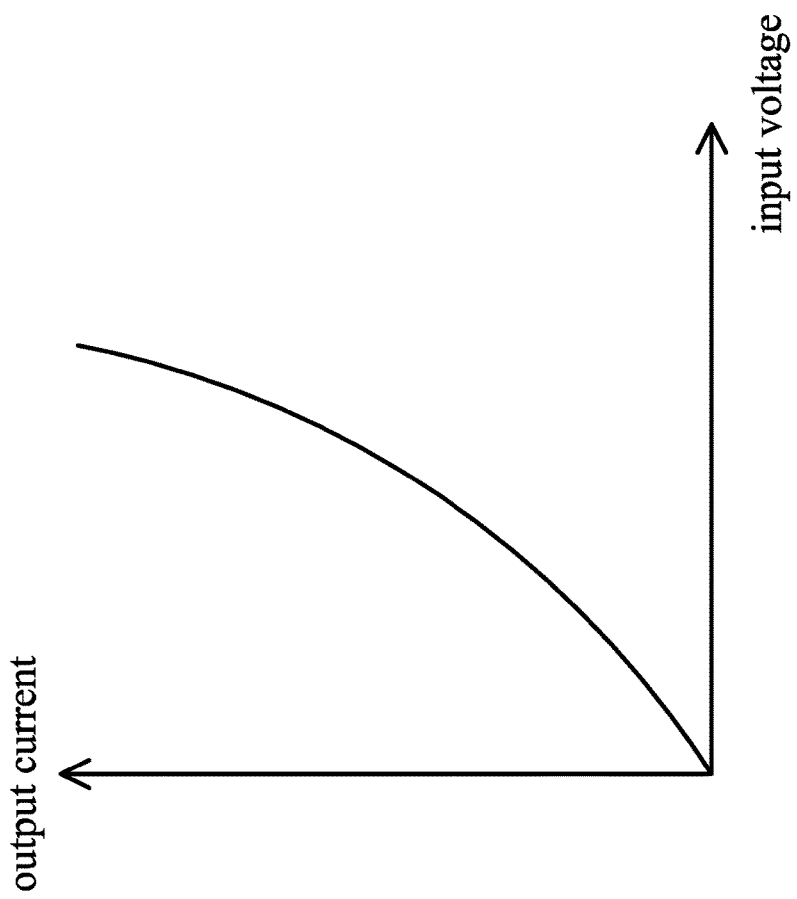
FIG. 1B shows the relationship between the voltage and current of a transconductance circuit.

In some embodiments, the transconductance circuit 101 may be a metal-oxide-semiconductor field-effect transistor (MOSFET), bipolar junction transistor (BJT), or any other component or circuit which can exponentially transform a voltage into a current; therefore, the output current generated by the transconductance circuit 101 is exponentially related to the voltage received by the transconductance circuit 101, as shown in FIG. 1B. Accordingly, when the amplitude of the voltage signal $V_{SW}$ generated by the oscillator circuit 104 is increased, the average current of the current $I_1$ generated by the transconductance circuit 101 is also increased, and because of the tail current $I_s$ generated by the constant-current source 103 is a constant current, the average current of the current $I_2$ flowing through the reference current terminal $N_r$ of the current-mirror circuit 102 is decreased. Since the bias current $I_b$ flowing through the bias current terminal $N_b$ of the current-mirror circuit 102 and the current $I_2$ flowing through the reference current terminal $N_r$ are in a predetermined ratio, the average current of the bias current $I_b$ is decreased when the average current of the current $I_2$ is decreased. In this case, the oscillator circuit 104 receives the bias current $I_b$, which is decreased as mentioned above, and the decreased bias current $I_b$ makes the voltage signal $V_{SW}$ generated by the oscillator circuit 104 to be decreased.

As the operations of the automatic power-control system 100 mentioned in current embodiment, the amplitude of the voltage signal $V_{SW}$ generated by the oscillator circuit 104 is inversely proportional to the bias current $I_b$ provided by the bias-current-control circuit 105. Accordingly, the amplitude of the voltage signal $V_{SW}$ and the current value of the bias current $I_b$ perform a negative feedback operation; therefore, the automatic power-control system 100 can adjust the amplitude of the voltage signal $V_{SW}$ of the oscillator circuit 104 automatically, which allows the oscillator circuit 104 to maintain the oscillation operation through the bias current $I_b$, which is set by the designer, and achieves the purpose of controlling the bias current $I_b$ and power consumption.

Figure 2A:
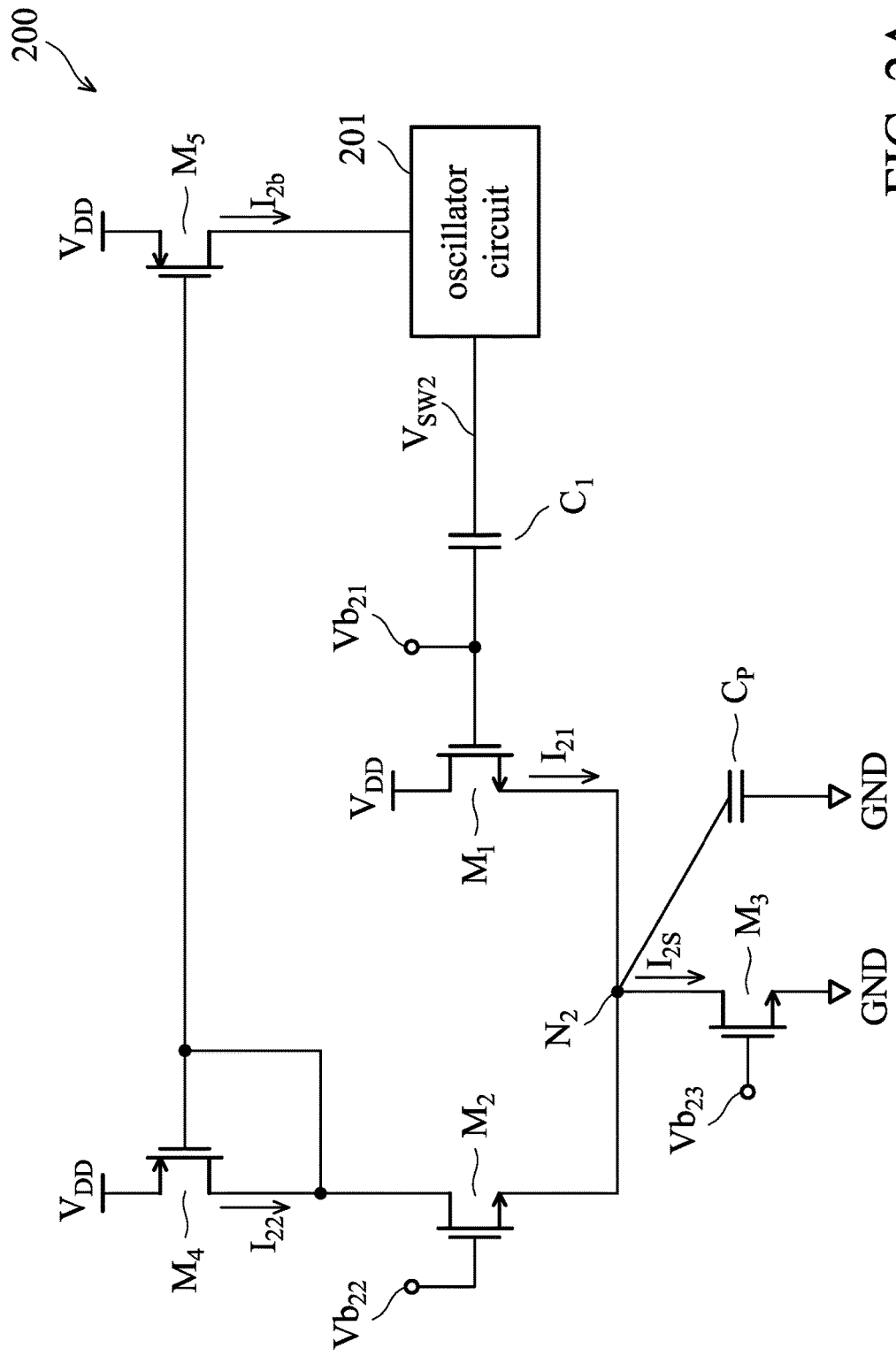
FIG. 2A is a schematic diagram of an automatic power-control system according to some embodiments of the present disclosure.

FIG. 2A shows a schematic diagram of an automatic power-control system 200. The automatic power-control system 200 comprises the oscillator circuit 201 and a bias-current-control circuit including MOSFETs $M_1$-$M_5$. In this embodiment, the steady state value of the bias current $I_{2b}$, which biases the oscillator circuit 201, is a predetermined current value, and the steady state value of the amplitude of the voltage $V_{SW2}$ of the oscillator circuit 201 is a predetermined voltage value. Based on the operation of the bias-current-control circuit including MOSFETs $M_1$-$M_5$, if the amplitude of the voltage signal $V_{SW2}$ or the bias current $I_{2b}$ of the oscillator circuit 201 is changed, then the automatic power-control system 200 performs a negative feedback operation automatically, which makes the voltage signal $V_{SW2}$ converge to the predetermined voltage value and the bias current $I_{2b}$ converge to the predetermined current value. In one embodiment, if the amplitude of the voltage signal $V_{SW2}$ is decreased, the decreased voltage signal $V_{SW2}$ is coupled to the gate of the MOSFET $M_1$ (which corresponds to the transconductance circuit 101 in FIG. 1A) through the capacitor $C_1$ and decreases the average current of the current $I_{21}$ generated by the MOSFET $M_1$. Since the voltage values of the DC voltage $V_{DD}$, $Vb_{21}$, $Vb_{22}$, $Vb_{23}$, and the ground terminal GND are fixed, the tail current $I_2$ generated by the MOSFET $M_3$ (which is provided as a constant-current source) is also fixed. Accordingly, if the average current of the current $I_{21}$ is decreased, then the current $I_{22}$ flowing through the MOSFETs $M_2$ and $M_4$ is increased. In the present embodiment, the current $I_{21}$ affected by the voltage signal $V_{SW2}$ is the combination of an AC current component and DC current component, wherein the AC current component of the current $I_{21}$ is filtered by the parasitic capacitor $C_p$ (which is connected to the MOSFET $M_3$ in parallel) connected to the node $N_2$. Therefore, the current $I_{22}$ is affected by a filtered current (which is the filtered current $I_{21}$) and then increased.

In the present embodiment, the current-mirror circuit with the MOSFETs $M_4$ and $M_5$ generates the bias current $I_{2b}$ based on the current $I_{22}$. Since the bias current $I_{2b}$ and the current $I_{22}$ are in a predetermined ratio (for example, 1:1), the current $I_{2b}$ is increased based on the increase of the current $I_{22}$. Accordingly, the increased bias current $I_{2b}$ flowing to the oscillator circuit 104 increases the decreased amplitude of the voltage signal $V_{SW2}$. Based on the negative feedback operation, the amplitude of the voltage signal $V_{SW2}$ is going to converge to the predetermined voltage value, and the bias current $I_{2b}$ is going to converge to the predetermined current value.

In one embodiment, if the amplitude of the voltage signal $V_{SW2}$ is increased, then the average current of the current $I_{21}$ is also increased based on the circuit structure of the automatic power-control system 200, which decreases the current $I_{22}$; furthermore, the current $I_{2b}$ is also decreased and then causes the amplitude of the voltage signal $V_{SW2}$ to decrease. In this case, the automatic power-control system 200 automatically performs a negative feedback operation and makes the voltage signal $V_{SW2}$ converge to a predetermined voltage value and the bias current $I_{2b}$ converge to a predetermined current value.

Figure 2B:
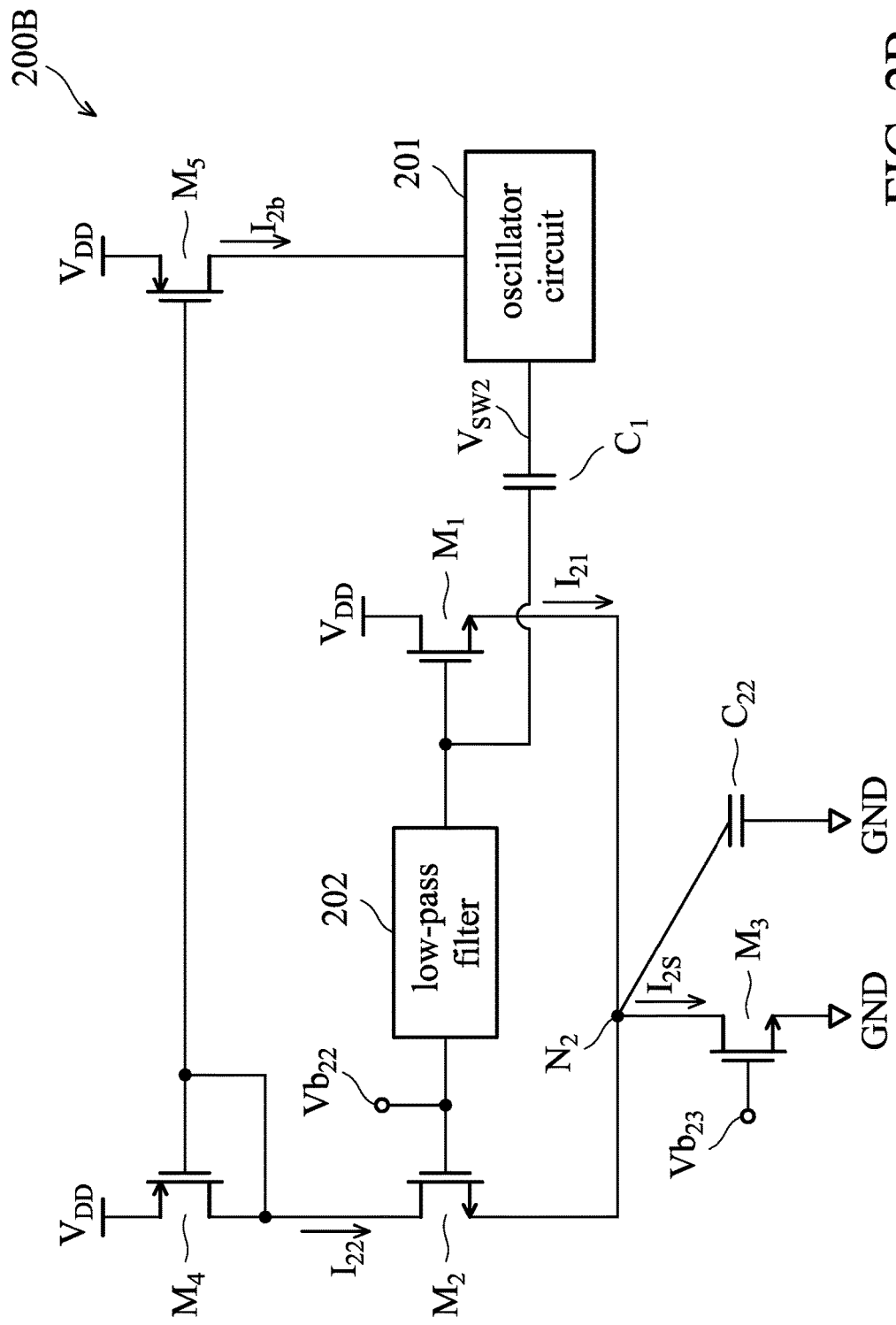
FIG. 2B is a schematic diagram of an automatic power-control system according to some embodiments of the present disclosure.

In some embodiments, the voltage values of the DC voltage $Vb_{21}$ and $Vb_{22}$ in FIG. 2A may be the same or different. In some embodiments, the gate of the MOSFETs $M_1$ and $M_2$ can be coupled to the same DC voltage through a low-pass filter, as shown in FIG. 2B. FIG. 2B shows a schematic diagram of an automatic power-control system 200B according to one embodiment of the present invention. In the automatic power-control system 200B, the input terminal and the output terminal of the low-pass filter 202 are connected to the gate of the MOSFET $M_1$ and the gate of the MOSFET $M_2$, respectively, which makes the MOSFET $M_2$ can not receive the voltage signal $V_{SW2}$. In this embodiment, the gates of the MOSFETs $M_1$ and $M_2$ can be coupled to the same DC voltage $Vb_{22}$ through the low-pass filter 202. In this embodiment, an additional capacitor is connected to the parasitic capacitor $C_p$ in parallel to construct the capacitor $C_{22}$ (which is connected to the MOSFET $M_3$ operating as a constant-current source in parallel), which improves the filtering performance on the AC current component of the current $I_{21}$. In some embodiments, the low-pass filter 202 may be a resistor with high resistance (for example, 10 k ohm). The operations, which perform the negative feedback operation, of the automatic power-control system 200B are similar to the automatic power-control system 200 and are omitted for conciseness.

Figure 3:
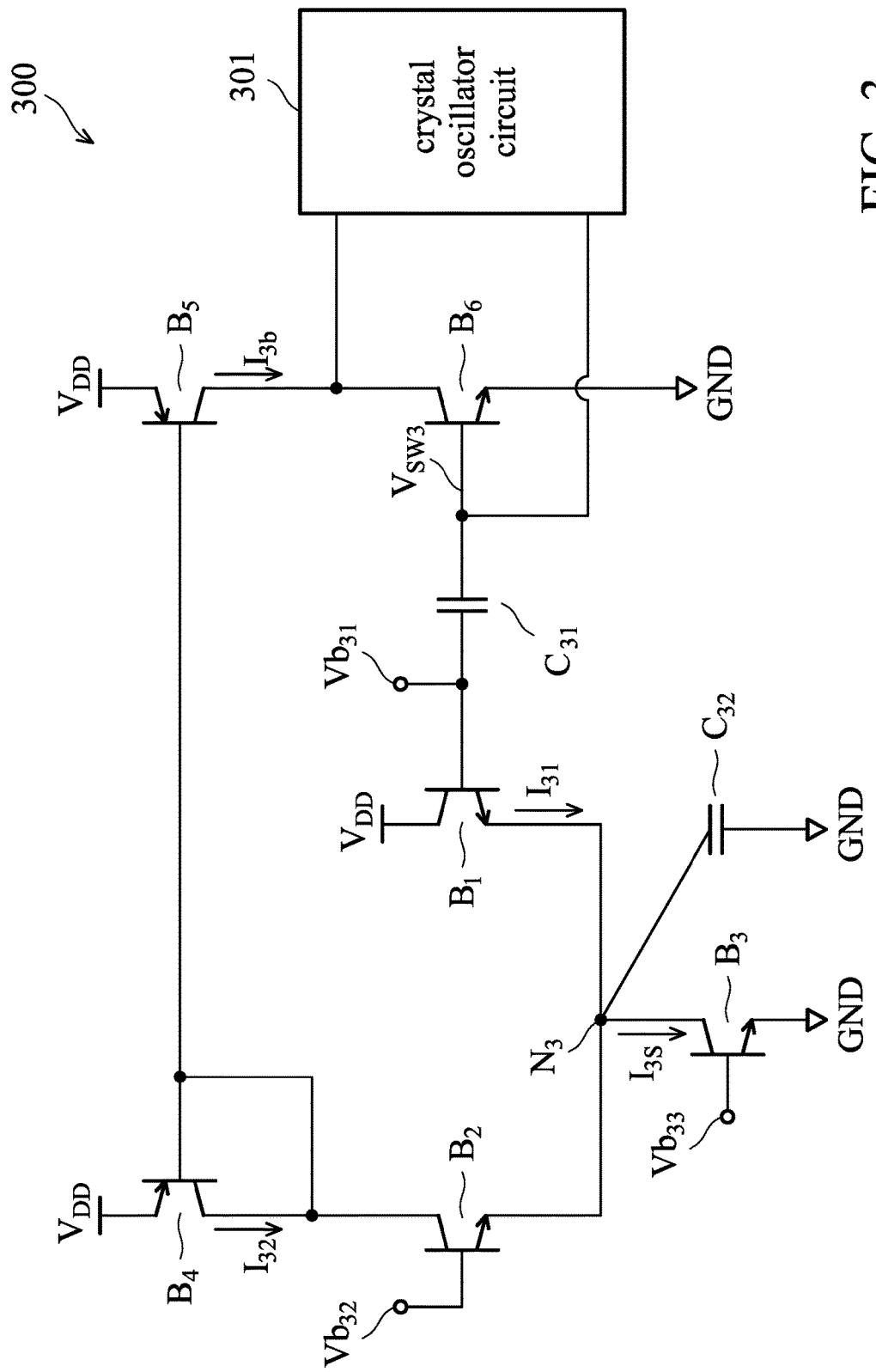
FIG. 3 is a schematic diagram of an automatic power-control system according to some embodiments of the present disclosure.

FIG. 3 shows a schematic diagram of an automatic power-control system 300. The automatic power-control system 300 comprises an oscillator circuit including the BJT $B_6$ and the crystal oscillator circuit 301; and a bias-current-control circuit including BJTs $B_1$-$B_5$. In this embodiment, the steady state value of the bias current $I_{3b}$ is a predetermined current value, and the steady state value of the amplitude of the voltage $V_{SW3}$ is a predetermined voltage value. Based on the operation of the bias-current-control circuit including BJTs $B_1$-$B_5$, if the amplitude of the voltage signal $V_{SW3}$ or the bias current $I_{3b}$ is changed, then the automatic power-control system 300 performs a negative feedback operation automatically and makes the voltage signal $V_{SW3}$ converge to the predetermined voltage value and the bias current $I_{3b}$ converge to the predetermined current value.

In one embodiment, if the amplitude of the voltage signal $V_{SW3}$ is increased, the increased voltage signal $V_{SW3}$ is coupled to the base of the BJT $B_1$ through the capacitor $C_{31}$ and increases the average current of the current $I_{31}$ generated by the BJT $B_1$. Since the voltage values of the DC voltage $V_{DD}$, $Vb_{31}$, $Vb_{32}$, $Vb_{33}$, and the ground terminal GND are fixed, the tail current $I_3$, generated by the BJT $B_3$, which operates as a constant current source, is also fixed. In this embodiment, the current $I_{31}$ affected by the voltage signal $V_{SW3}$ is the combination of an AC current component and DC current component, wherein the AC current component of the current $I_{31}$ is filtered by the capacitor $C_{31}$ (which is constructed by connecting the parasitic capacitor of the node $N_3$ and an additional capacitor in parallel) connected to the node $N_3$. Therefore, the current $I_{32}$ flowing through BJTs $B_2$ and $B_4$ is affected by a filtered current (which is the filtered current $I_{31}$) and then decreased.

In the present embodiment, the current-mirror circuit with the BJTs $B_4$ and $B_5$ generates bias current $I_{3b}$ based on the current $I_{32}$. Since the bias current $I_{3b}$ and the current $I_{32}$ are in a predetermined ratio (for example, 1:1.5), the current $I_{3b}$ is decreased based on the decrease of the current $I_{32}$. Accordingly, the decreased bias current $I_{3b}$ makes the increased amplitude of the voltage signal $V_{SW3}$ to be decreased. Finally, according to the negative feedback operation described above, the amplitude of the voltage signal $V_{SW3}$ is going to converge to the predetermined voltage value, and the bias current $I_{3b}$ is going to converge to the predetermined current value.

Figure 4:
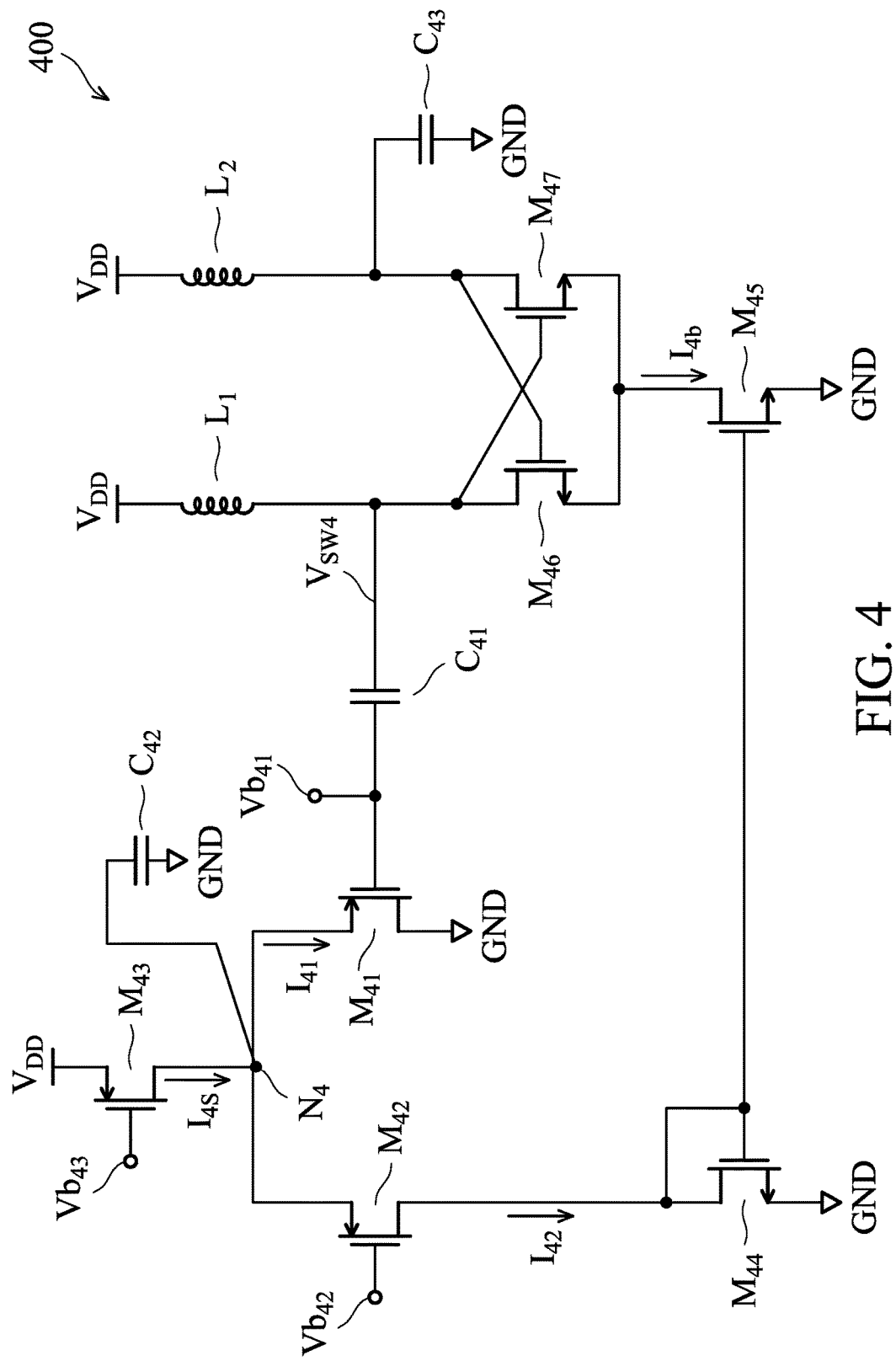
FIG. 4 is a schematic diagram of an automatic power-control system according to some embodiments of the present disclosure.

FIG. 4 shows a schematic diagram of an automatic power-control system 400 according to some embodiments of the present invention. The automatic power-control system 400 includes an oscillator circuit and a bias-current-control circuit. The oscillator circuit comprises MOSFETs $M_{46}$-$M_{47}$, inductors $L_1$-$L_2$, capacitor $C_{41}$, capacitor $C_{43}$, and the bias-current-control circuit comprises MOSFETs $M_{41}$-$M_{45}$. In this embodiment, since the voltage values of the DC voltage $V_{DD}$, $Vb_{41}$, $Vb_{42}$, $Vb_{43}$, and ground terminal GND are fixed, the tail current $I_{4S}$, generated by the MOSFET $M_{43}$ (which operates as a constant current source) is also fixed. The MOSFET $M_{41}$ generates the current $I_{41}$ according to the voltage signal $V_{SW4}$ of the oscillator circuit. The current $I_{42}$ flowing through MOSFET $M_{42}$ and $M_{44}$ is equal to the current difference between the tail current $I_{4S}$, of the MOSFET $M_{43}$ (which operates as a constant-current source) and the current $I_{41}$. The current-mirror circuit including MOSFET $M_{44}$ and $M_{45}$ generates the bias current $I_{4b}$ based on the current $I_{42}$.

In this embodiment, the steady state value of the bias current $I_{4b}$ is a predetermined current value, and the steady state value of the amplitude of the voltage $V_{SW4}$ is a predetermined voltage value. Based on the operation of the bias-current-control circuit including MOSFETs $M_{41}$-$M_{45}$ and the capacitor $C_{42}$ (which is constructed by connecting the parasitic capacitor of the node $N_4$ and an additional capacitor in parallel), if the voltage signal $V_{SW4}$ or the bias current $I_{4b}$ is changed, then the automatic power-control system 400 performs a negative feedback operation automatically and makes the voltage signal $V_{SW4}$ converge to the predetermined voltage value and the bias current $I_{4b}$ converge to the predetermined current value.

In one embodiment, if the amplitude of the voltage signal $V_{SW4}$ is decreased, the decreased voltage signal $V_{SW4}$ is coupled to the gate of the MOSFET $M_{41}$ through the capacitor $C_{41}$ and decreases the average current of the current $I_{41}$ generated by the MOSFET $M_{41}$. The decrease of the average current of the current $I_{41}$ increases the current $I_{42}$. The current $I_{41}$ is the combination of an AC current component and DC current component, wherein the AC current component of the current $I_{41}$ is filtered by the capacitor $C_{41}$ (which is constructed by connecting the parasitic capacitor of the node $N_4$ and an additional capacitor in parallel) connected to the node $N_4$. Therefore, the current $I_{42}$ is affected by a filtered current (which is the filtered current $I_{41}$) and then increased. In this embodiment, the current-mirror circuit with the MOSFETs $M_{44}$ and $M_{45}$ generates bias current $I_{4b}$ based on the current $I_{42}$. Since the bias current $I_{4b}$ and the current $I_{42}$ are in a predetermined ratio (for example, 1.5:1), the current $I_{4b}$ is increased based on the increase of the current $I_{42}$. Accordingly, the increased bias current $I_{4b}$ increases the decreased amplitude of the voltage signal $V_{SW4}$. Finally, according to the negative feedback operation described above, the amplitude of the voltage signal $V_{SW4}$ is going to converge to the predetermined voltage value, and the bias current $I_{4b}$ is going to converge to the predetermined current value.

In one embodiment, if the amplitude of the voltage signal $V_{SW4}$ is increased, then the automatic-power-control system 400 performs a negative feedback operation automatically and makes the amplitude of the voltage signal $V_{SW4}$ converge to the predetermined voltage value and the bias current $I_{4b}$ converge to the predetermined current value.

Figure 5:
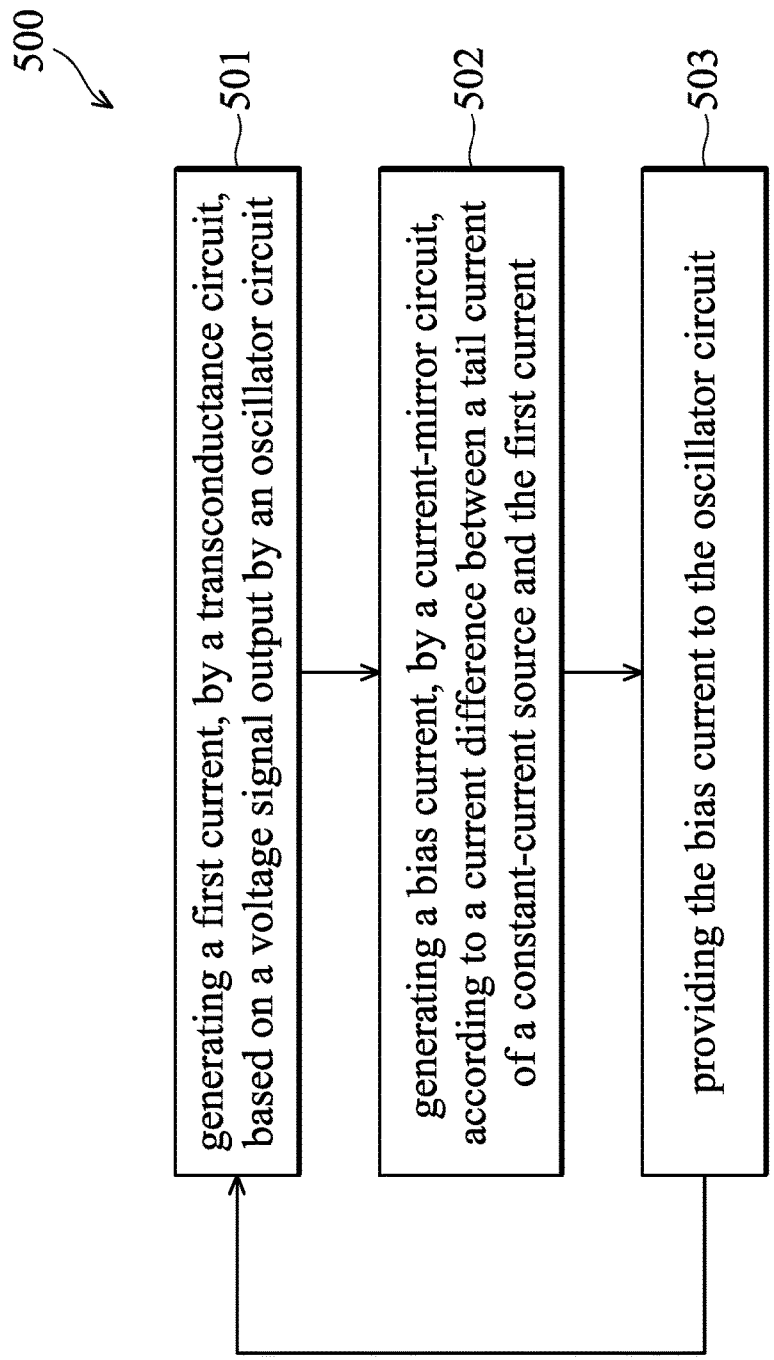
FIG. 5 is a flow chart of an automatic power-control method according to some embodiments of the present disclosure.

FIG. 5 shows the flow chart 500 of the automatic-power-control method according to some embodiments of the present invention. In step 501, the method generates a first current, by a transconductance circuit, based on a voltage signal output by an oscillator circuit. In step 502, the method generates a bias current, by a current-mirror circuit, according to a current difference between a tail current of a constant-current source and the first current. In step 503, the method provides the bias current to the oscillator circuit. In this embodiment, the current value of the first current and the amplitude of the voltage signal are positively correlated; the current values of the bias current and the first current are negatively correlated; and the current value of the bias current and the amplitude of the voltage signal are positively correlated. Accordingly, the flow chart 500 describes a negative feedback operation of the bias current and the amplitude of the voltage signal. The amplitude of the voltage signal is going to converge to a predetermined voltage value, and the bias current is going to converge to a predetermined current value.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A bias-current-control circuit, comprising:
   a transconductance circuit, connecting a node and detecting a voltage signal to generate a first current;
   a constant-current source, connecting the node and generating a tail current;
   a current-mirror circuit, including a reference current terminal and a bias current terminal, and the reference current terminal is coupled to the node;
   a second transconductance circuit, provided between the reference current terminal and the node; and
   a low-pass filter, wherein an input terminal of the low-pass filter is connected to a first input terminal of the transconductance circuit, and an output terminal of the low-pass filter is connected to a second input terminal of the second transconductance circuit;

wherein a second current which flows through the reference current terminal is determined by a current difference between the tail current and the first current;

wherein a bias current which flows through the bias current terminal is generated based on the second current;

wherein the second current and the bias current are in a predetermined ratio.

2. The bias-current-control circuit as claimed in claim 1, further comprising:
a capacitor, connected to the constant-current source in parallel;
wherein a filtered current is generated by filtering the first current through the capacitor;
wherein the second current is equal to a second current difference between the tail current and the filtered current.

3. The bias-current-control circuit as claimed in claim 1, wherein the transconductance circuit and the second transconductance circuit are metal-oxide-semiconductor field-effect transistors or bipolar junction transistors.

4. An automatic power-control system, comprising:
an oscillator circuit, outputting a voltage signal; and
a bias-current-control circuit, including:
a transconductance circuit, connecting a node and detecting the voltage signal to generate a first current;
a constant-current source, connecting the node and generating a tail current;
a current-mirror circuit, including a reference current terminal coupled to the node and a bias current terminal connected to a current input terminal of the oscillator circuit;
a second transconductance circuit, provided between the reference current terminal and the node; and
a low-pass filter, wherein an input terminal of the low-pass filter is connected to a first input terminal of the transconductance circuit, and an output terminal of the low-pass filter is connected to a second input terminal of the second transconductance circuit;
wherein a second current which flows through the reference current terminal is determined by a current difference between the tail current and the first current;
wherein a bias current which flows through the bias current terminal is generated based on the second current;
wherein the second current and the bias current are in a predetermined ratio.

5. The automatic power-control system as claimed in claim 4, wherein the bias-current-control circuit further comprises:
a capacitor, connected to the constant-current source in parallel;
wherein a filtered current is generated by filtering the first current through the capacitor;
wherein the second current is equal to a second current difference between the tail current and the filtered current.

6. The automatic power-control system as claimed in claim 4, wherein the bias-current-control circuit further comprises:
a capacitor, connected to the constant-current source in parallel;
wherein a filtered current is generated by filtering the first current through the capacitor;
wherein the second current is equal to a second current difference between the tail current and the filtered current.

7. The automatic power-control system as claimed in claim 4, wherein the bias-current-control circuit further comprises:
a capacitor, connected to the constant-current source in parallel;
wherein a filtered current is generated by filtering the first current through the capacitor;
wherein the second current is equal to a second current difference between the tail current and the filtered current.

8. The automatic power-control system as claimed in claim 4, wherein the transconductance circuit and the second transconductance circuit are metal-oxide-semiconductor field-effect transistors or bipolar junction transistors.

9. An automatic power-control method, comprising:
generating, by a transconductance circuit, a first current based on a voltage signal output by an oscillator circuit;
generating, by a current-mirror circuit, a second current according to a current difference between the first current and a tail current of a constant-current source;
providing a second transconductance circuit between a reference current terminal of a current-mirror circuit;
providing a low-pass filter, wherein an input terminal of the low-pass filter is connected to a first input terminal of the transconductance circuit, and an output terminal of the low-pass filter is connected to a second input terminal of the second transconductance circuit;
determining a second current flowing through the reference current terminal by computing the difference between the tail current and the first current; and
generating a bias current based on the second current and providing the bias current to the oscillator circuit;
wherein the second current and the bias current are in a predetermined ratio.

* * * * *